United States Patent [19]

Goubault

[11] Patent Number: 5,905,977
[45] Date of Patent: May 18, 1999

[54] METHOD FOR AUTOMATIC DEMONSTRATION

[75] Inventor: Jean Goubault, Paris, France

[73] Assignee: Bull S.A., Louveinnes, France

[21] Appl. No.: 08/881,374

[22] Filed: Jun. 24, 1997

Related U.S. Application Data

[63] Continuation of application No. 08/424,489, filed as application No. PCT/FR94/01089, Sep. 19, 1994, abandoned.

[30]     Foreign Application Priority Data

Sep. 17, 1993 [FR] France .................................. 93 11080

[51] Int. Cl.$^6$ .................................................... G06F 15/18
[52] U.S. Cl. ................................................................ 706/46
[58] Field of Search ..................... 395/51, 500; 364/489; 706/46

[56]                 References Cited

U.S. PATENT DOCUMENTS

| | | | |
|---|---|---|---|
| 5,243,538 | 9/1993 | Okuzawa et al. ........................ | 364/489 |
| 5,331,568 | 7/1994 | Pixley ..................................... | 364/489 |
| 5,434,794 | 7/1995 | Coudert et al. .......................... | 364/489 |
| 5,493,504 | 2/1996 | Minato .................................... | 364/488 |
| 5,574,893 | 11/1996 | Southgate et al. ....................... | 395/500 |

FOREIGN PATENT DOCUMENTS 0351842   1/1990   European Pat. Off. .......... G06F 9/44

OTHER PUBLICATIONS

Schneider et al., Hardware–Verification using first order BDDs, Proceedings of the 11th IFIP, pp. 45–62, Apr. 26, 1993.

Coudert et al., Fault tree analysis: 10/sup20/prime implicants and beyond, Annual Reliability and Maintainability Symposium 1993, pp. 240–245, Jan. 28, 1993.

Minato et al., Shared binary decision diagram with attributed edges for efficient Boolean function manipulation, 27th ACM/IEEE Design Automation Conference, Proceedings 1990, pp. 52–57, Jun. 28, 1990.

Stanion et al., Tsunami: a path oriented scheme for algebraic test generation, Fault tolerant computing, 21st intl. symposium, pp. 36–43, Jun. 27, 1991.

Takahashi et al., Fault simulation for multiple faults using shared BDD representation of fault sets, 1991 IEEE International conference on computer–aided design, pp. 550–553, Nov. 14, 1991.

Proceedings of the 11th IFIP WG10.2 International Conference on Computer Hardware Description Languages and Their Applications, Apr. 26, 1993, Ottawa Ontario Canada pp. 45–62 Schneider et al "Hardware verification using first oder bdds" see entire document.

GWAI–92: Advance in Artificial Intelligence 16th German Conference on Artificial Intelligence Proceedings, Aug. 31, 1992, Bonn Allemagne pp. 67–76 Posegga et al "Towards First–Order Deduction Based on Shannon Graphs" see entire document.

Chang et al., Technology mapping via transformations of function graphs, IEEE 1992 International Conference on Computer Design, pp. 159–162, Oct. 14, 1992.

Jacobi et al., Incremental reduction of binary decision diagrams, 1991 IEEE International Symposium on circuits and systems, pp. 3174–3177, Jun. 14, 1991.

*Primary Examiner*—Thomas G. Black
*Assistant Examiner*—Sanjiv Shah
*Attorney, Agent, or Firm*—Kerkam, Stowell, Kondracki & Clarke, P.C.; Edward J. Kondracki

[57]                 ABSTRACT

The invention relates to a method for automatic proving theorems describing physical systems in first order logic. This method is used to produce complex systems and is implemented with the aid of a computer in whose memory a theorem to be proved is represented by at least one binary decision diagram (BDD). The method seeks to reduce the BDD to a constant T, symbolizing truth, by a substitution, by constructing and exploring a search tree of possible substitutions. The tree is constructed by minimizing the branching factor and is explored by maximizing in accordance with the Shannon theory, the information gain obtained at each node of the search tree.

5 Claims, 3 Drawing Sheets

| ADDRESS | xi | Phi− | Phi+ |
|---|---|---|---|
| (1) | P(a) | → (2) | → (3) |
| (2) | P(b) | → V | → (3) |
| (3) | P(x) | → F | → V |

| ADDRESS | xi | Phi- | Phi+ |
|---|---|---|---|
| (1) | P(a) | → (2) | → (3) |
| (2) | P(b) | → V | → (3) |
| (3) | $P(x_1)$ | → (4) | → V |
| (4) | $P(x_2)$ | → F | → V |

METHOD FOR AUTOMATIC DEMONSTRATION

This is a continuation of application Ser. No. 08/424,489, filed May 17, 1995 and now abandoned, which is a 371 of PCT/FR94/01089 filed Sep. 19, 1994.

The invention relates to a method for automatic deduction, the essential task of which is to show that it is possible, from a desired result, to find a formal solution for achieving this result.

BACKGROUND OF THE INVENTION

At present, the increasing complexity of industrial products presents numerous problems in terms of their design, realization and utilization. To create such products, the human being uses his imagination in the succession of phases up to the definitive development of these products. Some of these phases are currently assisted by machines, such as machine tools and computer-assisted design software, but this list is not exhaustive.

The intelligence that the human being proves to have for putting the succession of the various phases into proper order is based on his reasoning. Passing from one step in reasoning to the next, however rigorous it may be, is often, not to say always, somewhat subconscious, resulting from an intuitive train of thought inherent in the structure of human thinking. This has its advantage of allowing him to reach his objectives faster by ignoring what is currently considered obvious.

However, short-circuiting the fastidious processes of strict reasoning by overly frequent recourse to intuition leads to mistakes.

These mistakes can be expressed as faults in the functioning of the product made, faults which are all the harder to detect and hence eliminate, the rarer and more widely dispersed they are.

FIELD OF THE INVENTION

The formal specification of a system is what makes it possible to erect this system by simple execution. Doing so consists of specifying the information processing system in a language that although it resembles a programming language nevertheless has the purpose not of calculating but of describing a system. This language is endowed with mathematical semantics that precisely defines the significance of all the constructions in the language. Hence every specification in the language will have a precise meaning, in the form of mathematical axioms. This list of axioms can be represented and processed by machine. In addition, the properties that we desire to verify will also be expressible in the form of mathematical theorems and processable by information processing theorem proving tools, which are either automatic or semiautomatic.

Rather than representing the mathematical formulas in the memory of a computer for processing, it would be possible to contemplate having them proved by human beings. However, that would be time-consuming and expensive and moreover would not prevent the frequent mistakes in reasoning made by a human being. This is why information processing tools for proving theorems have been conceived of. The semiautomatic tools for the most part organize the axioms that describe the language and the specifications, as well as the propositions to be proved on the system, in a data base on which a human user can act by way of well-defined and guaranteed-correct operations of deduction. This prevents human errors but enormously slows down the verification of the system, since the human operator must prove that his system is correct by indicating to the proof tools not only the reasons, in the form of deduction principles or axioms to be used, why he thinks it is correct, but also all the boring details of manipulations of symbols, which are also axioms, and are often perceived of as obvious to a human being.

DESCRIPTION OF THE RELATED ART

An automatic Theorem prover thus has the task, within a semiautomatic proof tool, of aiding in proving these points of obviousness, and as needed to prove the portions that are even less obvious. This lends appreciable comfort to the human operator, assisted by the machine that works in parallel with him; the result is faster, but also strict, proof of the theorems that represent the properties that certify good operation of the specific information processing systems.

The known automatic deduction techniques in the prior art (resolution, semantic tableaux, method of connections/ matings, etc.) offer only relative help, particularly because they can spend disproportionate amounts of time on problems perceived of as being quite similar in terms of their difficulty. The automatic deduction technique identifies the idea of difficulty in terms of a size of a proof search tree, identified by its depth and its width. While the depth is a characteristic of the theorem to be demonstrated, the width is a characteristic of the theorem and of the method of searching for proof. The method according to the invention minimizes this tree width step by step, and at the same time, explores the tree created, in accordance with a strategy known as maximum information gain-first traversal, whose purpose is to prove and define the fastest possible proof.

SUMMARY OF THE INVENTION

The object of the invention is a method of automatic proof of theorems using classical first order logic making it possible to increase the confidence provided, in product development, by the formalism of machine controlled solutions.

This method is especially valuable in information processing, to verify the communications protocols in multiprocessor architecture, to establish specifications based on programs, or in a process of refining a formal specification for establishing a program.

More precisely, the method for automatic proof of propositions describes physical systems in first order logic. It is implemented with the aid of a computer in whose memory a proposition to be proved is represented by at least one binary decision diagram BDD. The method is characterized in that the method seeks to reduce the BDD to a constant T, standing for the truth, by at least one substitution, by constructing and exploring a search tree of possible substitutions, each node of which is associated with one BDD.

In another subject of the invention, the search tree is constructed by minimizing its branching factor and is explored by maximizing the information gain, calculated at each node of the search tree.

In yet another subject of the invention, the information gain is calculated, at each node associated with a BDD Phi, by subtracting as the difference between the quantity of information Qi(Phi) at the node and the quantity of information at the root of the search tree, said difference being lessened by the sum of the logarithms of the number of immediate successors of the nodes from the branch between the root and the node in question, including the root and excluding the node in question, where Qi(Phi)=bF log(bF/(bF+bT)), and where bF is the number of false branches of the BDD Phi, and bT is the number of true branches of the BDD Phi.

BRIEF DESCRIPTION OF THE DRAWINGS

Further characteristics and advantages will become more apparent from reading the ensuing description in conjunction with the drawings, in which.

DESCRIPTION OF THE PREFERRED EMBODIMENTS

Figure 5:
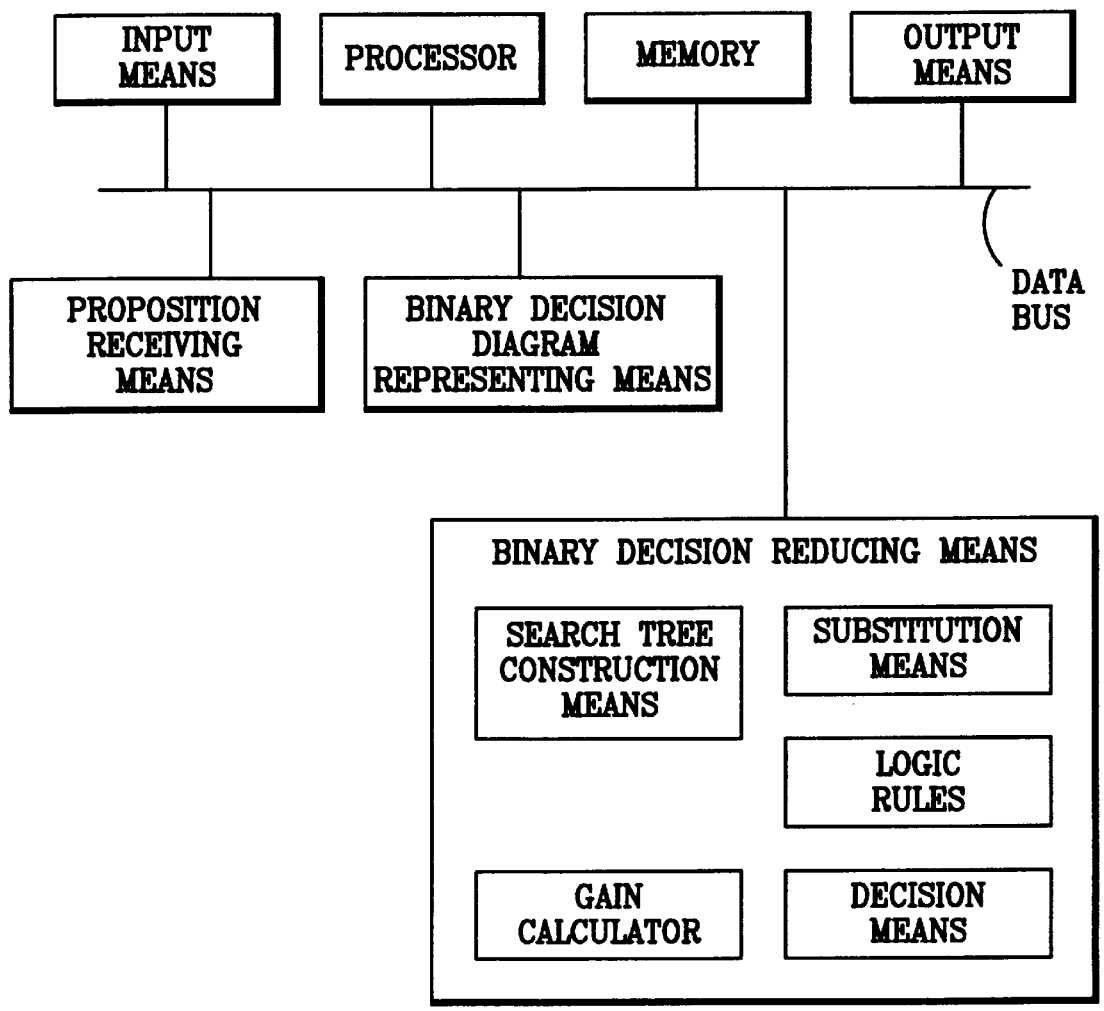
FIG. 5 is a block diagram of the system in accordance with preferred embodiment of the invention.

Appendixes 1–9 describe the functions, which are recursive, employed by means of a computer in order to construct the binary decision diagram, hereinafter called BDD, of a propositional formula Phi in prenex form. A formula is in prenex form when the quantifiers of its variables are located at the head of the formula. The system for performing these function is illustrated in block diagram form in FIG. 5.

We will now explain each of the functions in appendixes 1–9 with the aid of the simple example of a propositional formula Phiex:

$$P(a) \text{ or } P(b) \Rightarrow P(x).$$

The processing of more complex formulas is done in an identical way, but it is preferable to leave that to the computer.

Each of the predicates P(a), P(b), P(x) constitutes an atomic formula xi of the formula Phiex. Constructing a BDD is done using the remark by Claude Shannon, who says that for every propositional variable, and in particular for the atomic formula xi, hereinafter called atom, a propositional formula Phi can be represented in the following form:

$$(xi \Rightarrow Phi+) \text{ and } (\neg xi \Rightarrow Phi-),$$

where ¬xi symbolizes the logical negation of the atom xi, and where the atom xi does not appear in either Phi+ or Phi−. For two constants T and F, representing truth and falsehood, respectively, it suffices in fact to choose, for Phi+, the formula Phi where T is substituted for the atom xi, and for Phi−, the formula Phi where F is substituted for the atom xi.

The BDD of a formula Phi, hereinafter called Phi, is accordingly a datum, in the information processing sense of this word, whose type is defined by three possible values: the value T, the value F, or the value of the choice of an atom xi, of the BDD of the formula Phi− and the BDD of the formula Phi+, hereinafter called Phi− and Phi+, respectively.

Appendix 1 describes the function BDDmake as a function with three parameters: an atom xi, a BDD Phi−, and a BDD Phi+. The result of a function is represented by the symbol :=. If the two BDDs, Phi− and Phi+, are equal then the function returns the BDD Phi+; if not, it returns the result of the call to the function Choice(xi,Phi−,Phi+). In effect, if Phi− and Phi+ are equal, this signifies that the value of the BDD Phi is independent of the atom xi, and that it accordingly has the same value as the BDD Phi+.

Figures 1, 2:
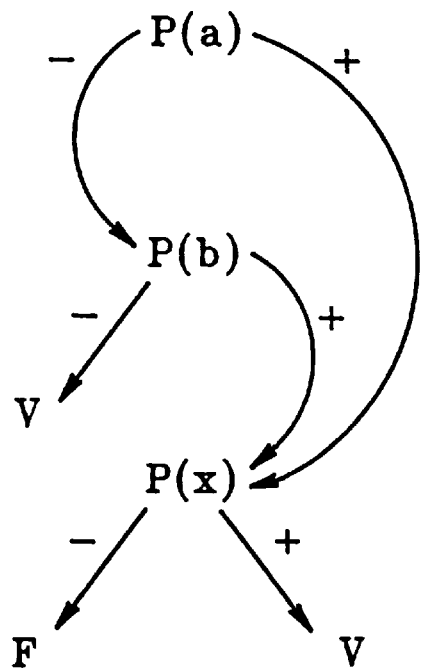
FIG. 1 shows the binary decision diagram BDD with a simple formula as an example.
FIG. 2 shows a possible example of storage in computer memory of the diagram of FIG. 1.

The Choice function of an atom A of a BDD Phi1 and a BDD Phi2 represents the head of a BDD constituted by the atom A and by two branches making up the Phi1 and Phi2 BDDs. The result of this function can be represented in computer memory, for example in the form of a line in a table with three fields, as shown in FIG. 2.

The function of Appendix 2 embodies the fact that the negation of T is F, and vice versa, and that the negation of ((xi→Phi+) and (¬xi→Phi−)) is ((xi→¬Phi+) and (¬xi→¬Phi−)).

The function of Appendix 3 embodies the fact that the conjunction of a BDD Phi and a BDD Phi' is false if one of the BDDs is false, and the other BDD if one of the BDDs is true. If Phi=Choice(xi,Phi−,Phi+) and Phi'=Choice(xi',Phi'−,Phi'+), when xi=xi', then one notes that:

((xi→Phi+) and (¬xi→Phi−)) and ((xi→Phi'+) and (¬xi→Phi'−)) is logically equivalent to ((xi→Phi+ and Phi'+) and (¬xi→Phi− and Phi'−)), which yields the last line of Appendix 3.

When xi precedes xi' in the order defined of the atoms, this means that xi does not appear in Phi'; ((xi→Phi') and (¬xi→Phi')) is logically equivalent to Phi'. Then:

((xi→Phi+) and (¬xi→Phi−)) and ((xi→Phi') and (¬xi→Phi')) is logically equivalent to:

((xi→Phi+ and Phi') and (¬xi→Phi− and Phi')). This remark remains valid if xi is replaced by xi' and Phi is replaced by Phi', which yields the other lines of Appendix 3.

The function of Appendix 4 embodies the fact that the disjunction of a BDD Phi and a BDD Phi' is T if one of the BDDs is T, and the other BDD if one of the BDDs is F. If Phi=Choice(xi,Phi−,Phi+) and Phi'=Choice(xi',Phi'−,Phi'+), when xi=xi', one notes that:

((xi→Phi+) and (¬xi→Phi−)) or ((xi→Phi'+) and (¬xi→Phi'−)) is logically equivalent to:

((xi→Phi+ or Phi'+) and (¬xi→Phi− or Phi'−)), which results in the last line of Appendix 4.

When xi precedes xi' in the order defined in the atoms, this means that xi does not appear in Phi', ((xi→Phi') and (¬xi→Phi')) is logically equivalent to Phi'. Then:

((xi→Phi+) and (¬xi→Phi−)) or ((xi→Phi') and (¬xi→Phi')) is logically equivalent to:

((xi→Phi+ or Phi') and (¬xi→Phi− or Phi')). This note remains valid if xi is replaced by xi' and Phi is replaced by Phi', which results in the other lines of Appendix 4.

By way of example, to understand this, let us apply the BDDmake function of Appendix 1 to the formula Phiex. The construction of the BDD is done in the order in which the formula Phiex is read, and the first subformula encountered is:

P(a) or P(b).

Phia := BDDmake(P(a),Phia−,Phia+); the test of equality on Phia− and Phia+ requires the calculation of:

Phia− := BDD or (F,Phib) and Phia+ := BDDor(T,Phib). In Appendix 4, Phia− := Phib, with Phib=Choice(P(b), F,T), and Phia+ := T. Since Phia− and Phia+ are different, Phia := Choice(P(a),Phib,T).

The sign following the formula Phiex is the logical implication, which is translated by Phiex := BDDor (BDDneg(Phia), Phix) with Phix=Choice(P(x),F,T)

In accordance with Appendix 2,

BDDneg(Phia) := Choice (P(a), BDDneg(Phib), F)

BDDneg(Phib) := Choice (P(b),T, F)

According to Appendix 4, xi=P(a) precedes xi'=P(x), in the order of reading. Phiex := BDDmake (P(a), BDDor (BDDneg(Phib),Phix), BDDor(F,Phix)).

BDDor(BDDneg(Phib),Phix) := BDDmake(P(b), BDDor (T,Phix), BDDor(F,Phix)) := BDDmake(P(b),T, Phix). Finally, Phiex := Choice ( P(a),Choice(P(b),T,Phix),Phix).

The representation of Phiex in computer memory is schematically represented by the table of FIG. 2 and symbolized by the drawing of FIG. 1.

In Appendix 5, the function repfalse(Phi,xi') replaces the atom xi' with F in Phi. If xi' does not appear in Phi, the result is Phi which remains unchanged, if the atom xi' appears in Phi. Either it appears at the root of Phi, and then, replacing the atom xi' with F means taking Phi–. Or the atom xi at the root of Phi precedes the atom xi' in the order defined of the atoms and then, replacing the atom xi' with F in Phi means replacing the atom xi' with F in Phi– and in Phi+.

In Appendix 6, the function repfalse(Phi,xi') replaces the atom xi' with T in Phi. If xi' does not appear in Phi, the result is Phi which remains unchanged. If the atom xi' appears in Phi. Either it appears at the root of Phi; then, replacing the atom xi' with T means taking Phi+. Or the atom xi at the root of Phi precedes the atom xi' in the order defined of the atoms; then, replacing the atom xi' with T in Phi means replacing the atom xi' with T in Phi– and in Phi+.

Appendix 7 describes the function BDDreduce(Phi,xi,xi'), which makes it possible to test whether the logical equivalence of two atomic formulas xi and xi' reduces Phi to T. The function BDDreduce leaves a BDD reduced to T or to F unchanged. Phi– and Phi+ are, respectively, the negative and the positive branch of a BDD Phi other than T or F, with eta as an atom at the root of the BDD. If the atom eta precedes the atom xi, in the defined order of the atoms, the BDD Phi is reconstructed with the aid of the function BDDmake of Appendix 1, with the atom eta preserved at its root and having as its branches Phi– and Phi+, which result from the recursive execution of the function BDDreduce for each of the branches Phi– and Phi+ with the same atoms xi and xi'. If the atom eta is the atom xi, the BDD Phi is reconstructed with the aid of the BDDmake function of Appendix 1, with the atom eta equal to the atom xi preserved at its root and having Phi– and Phi+ as its new branches, which result from the recursive execution of the function of Appendixes 5 and 6. That is, the atom xi', equivalent to the atom xi, is replaced by F in the branch Phi– of Phi, which interprets the atom xi as having been replaced by F, and the atom xi' is replaced by T in the branch Phi+ of Phi, which interprets the atom xi as having been replaced by T. If the atom eta follows the atom xi in the order defined for the atoms, then the BDD is reconstructed with the aid of the BDDmake function of Appendix 1, by placing the atom xi at the root and by taking for the Phi– branches the BDD Phi where the atom xi' is replaced with F by the recursive execution of the function of Appendix 5, and for the Phi+ branches the BDD Phi where the atom xi' is replaced with T. This produces an equivalent interpretation of the atoms xi and xi'.

Appendix 9 describes the function BDDreorder(Phi,vars), which reorders a BDD Phi in the order of the atoms of a list of atoms vars. This function is especially useful for combining two BDDs Phi and Phi', whose atoms obey different orders. The function leaves a BDD Phi that is equal to T or F unchanged. A BDD Phi other than T or F has an atom A at its root and two branches Phi– and Phi+. If the atom A is the first atom of the list vars, the list vars is then written as A::rest, where "rest" is the list that contains the atoms following the atom A. The BDD is reconstructed by the function of Appendix 1 with the atom A at its root and with Phi– and Phi+ as its branches; these branches result from the recursive execution of the BDDreorder function, and the new list vars is in the form of the list rest, respectively at the Phi– and Phi+ branches of the BDD Phi. Conversely, if the first atom of the list vars is an atom A' different from the atom A, then the list vars is again written A'::rest, where "rest" is the list of atoms following the atom A'. The BDD is reconstructed by the function of Appendix 1 with the atom A' returned to its root and with Phi– and Phi+ as the branches, which result from the recursive execution of the function BDDreorder, and the new list vars is in the form of the list rest at the branches Phi– and Phi+, respectively, of the BDD Phi, where A' is replaced with F in Phi– and T in Phi+.

Appendix 10 describes the function Bnegatives, which constructs a set of atoms for which there exists one branch Phi– of a BDD Phi, which itself is a BDD that ends in F. The set is empty if the BDD Phi is T or F. A BDD Phi other than F or T has one atom xi at its root and two BDDs Phi' and Phi+. The set is equal to the union, represented by a U, of the sets constructed for Phi– and Phi+ by recursive execution of the Bnegatives function on these BDDs and of the singleton containing the atom xi, if the BDD Phi– is different from T.

Appendix 11 describes the Bpositives function, which constructs a set of atoms for which there exists one branch Phi+ of a BDD Phi ending at F. The set is empty if the BDD Phi is T or F. A BDD Phi other than F or T has one atom xi at its root and 2 BDDs Phi– and Phi+. The set is equal to the union, represented by U, of the sets constructed for Phi– and Phi+ by recursive execution of the Bpositives function on these BDDs and of the singleton containing the atom xi, if the BDD Phi+ is other than T.

Appendix 12 describes the complement function, which constructs a set of atoms complementary to an atom A in a BDD Phi. The atoms complementary to an atom A are by definition the atoms for which there exists one branch Phi+ ending at F when A is replaced by F, and one branch Phi– ending at F when A is replaced by T. The set of complementary atoms is accordingly the union, represented by U, of the sets constructed by the Bpositives and Bnegatives functions for the BDD Phi, where the atom A is replaced by F and T, respectively.

In the example which we have given, with the order being the order in which the formula is written, that is, P(a)<P(b) <P(x), Phi=Choice (eta,Phi–,Phi+) with eta=P(a).

The unification of P(x) to P(a) yields the most general unifier mgu [a/x]. This means that P(x) and P(a) are considered logically equivalent, and the function of Appendix 7 is started with xi=P(a), xi'=P(x). The case is now such that eta=xi. The result is then:

BDDmake (P(a), repfalse(Phi–,P(x)), reptrue(Phi+,P(x))).

The functions repfalse and reptrue are defined respectively in Appendix 5 and 6.

In Appendix 5, the case is that in which Phia–=Choice(P (b),Phi–,Phi+) with P(b)<P(x), which gives the result:

BDDmake (P(b), repfalse(Phi−,P(x)), repfalse(Phi+,P(x))). One sees in FIG. 1 that repfalse(Phi−,P(x)) is the case in which Phi−=T, which gives T, and that repfalse (Phi+,P(x)) is the case in which Phi+=Choice(P(x),F,T), with xi=xi'=P(x), which yields F. The result is accordingly: BDDmake (P(b),T,F), that is, according to Appendix 1, Choice(P(b),T,F).

In Appendix 6, the case is that in which Phi=Choice(P(x),F,T) with xi=xi'=P(x), which gives the result Phi+, that is, T.

The result is accordingly:

BDD make (P(a), Choice(P(b),T,F), T), that is Choice (P(a), Choice(P(b),T,F), T). The equivalence of P(x) to P(a) is accordingly not sufficient to reduce Phi to T; a failure is the result. In the case of failure, an amplification procedure is performed. This procedure consists of making a disjunction of the BDD for which a failure has occurred, with an additional copy of this BDD for a new series of variables. If Phi1 is the preceding BDD with each variable x subscripted x1; then Phi2 is the additional BDD with each variable x subscripted x2.

In Appendix 4, BDDor (Phi1, Phi2) is the case in which Phi1=Choice(P(a),Phi1a,Phi1a+) and Phi2=Choice(P(a),Phi2a−,Phi2a+) with xi=xi'=P(a). In correlation with Appendix 1, this yields Choice(P(a), BDDor(Phi1a−,Phi2a−), BDDor(Phi1a+,Phi2a+)). The recursive successive appeals to the BDDor function then yield the following:

BDDor(Phi1a−,Phi2a−)=Choice(P(b), BDDor(Phi1b−, Phi2b−), BDDor(Phi1b+,Phi2b+));

BDDor(Phi1a+,Phi2a+)=Choice(P(x1), BDDor(Phi1x1−, Phi2x2), BDDor(Phi1x1+, Phi2x2));

BDDor(Phi1b−,Phi2b−)=T;

BDDor(Phi1b+,Phi2b+)=Choice(P(x1), BDDor(Phi1x1−, Phi2x2), BDDor(Phi1x1+,Phi2x2));

BDDor(Phi1x1−,Phi2x2)=Phi2x2=Choice(P(x2),F,T);

BDDor(Phi1x1+,Phi2x2)=T.

Figures 3, 4:
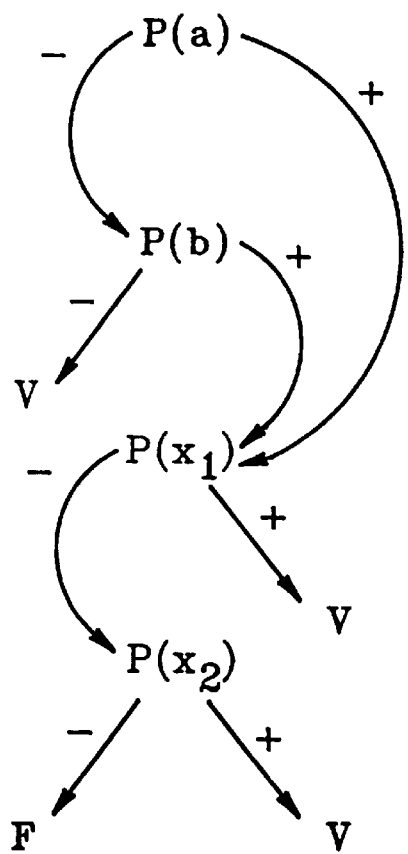
FIG. 3 shows another possible example of memorization of a binary decision diagram.
FIG. 4 shows the binary decision diagram BDD of the example of FIG. 1, with one additional copy of the initial formula.

The returns of recursivity finally yield the results stored in computer memory in the form of the table of FIG. 3, of which a symbolic representation is shown in FIG. 4.

Let us apply the functions of Appendixes 10 to 11 to the BDD Phiex made up of two copies of the starting formula.

```
Bnegatives (Phiex)
    Phiex = Choice(P(a),Phia−,Phia+)
    Bnegatives (Phia−)
        Phia− = Choice(P(b),T,Phib+)
        Bnegatives (Phib+)
            Phib+ = Choice(P(x1),Phix1−,T)
            Bnegatives (Phix1−)
                Phix1− = Choice(P(x2),F,T)
                := {P(x2)}
            :={P(x2),P(x1)}
        :={P(x2),P(x1)}
    Bnegatives (Phia+)
        Phia+ = Choice(P(x1),Phix1−,T)
            Phix1− = Choice(P(x2),F,T)
            :={P(x2)}
        :={P(x2),P(x1)}
    :={P(x2),P(x1),P(a)}
Bpositives (Phiex)
    Phiex = Choice(P(a),Phia−,Phia+)
    Bpositives (Phia−)
        Phia− = Choice(P(b),T,Phib+)
        Bpositives (Phib+)
            Phib+ = Choice(P(x1),Phix1−,T)
            Bpositives (Phix1−)
                Phix1− = Choice(P(x2),F,T)
                := {}
            := {}
```

```
        := {P(b)}
    Bpositives (Phia+)
        Phia+ = Choice(P(x1),Phix1−,T)
        Bpositives(Phix1−)
            Phix1− = Choice(P(x2),F,T)
            := {}
        := {}
    := {P(b),P(a)}
```

We then obtain Bnegatives(Phiex)={P(x2),P(x1),P(a)} and Bpositives(Phiex)={P(b),P(a)}. That is to say, the atoms P(x2),P(x1),P(a) are negative, or in other words there exists at least one false leaf of the BDD, when one of these atoms is replaced with F. Similarly, the atoms P(b),P(a) are positive, or in other words there exists at least one false leaf of the BDD when one of these atoms is replaced with T.

To determine the complementary atoms of P(a) in Phiex, the function of Appendix 12 is executed with A=P(a) and Phi=Phiex.

repfalse(Phiex,P(a))=Choice(P(b),T, Phib+), reptrue(Phiex,P(a))=Choice(P(x1),Phix1−,T).

Reusing the above results, the Bpositives(Choice(P(b),T,Phib+))={P(b)} and Bnegatives(Choice(P(x1),Phix1−,T))={P(x2),P(x1)}. Finally:

Complement (P(a),Phiex)={P(b),P(x2),P(x1)}. This set determines the complementary atoms with P(a) in Phiex.

In Appendix 7, the function BBDreduce gives the following results for BDDor(Phi1,Phi2). The order defined is now P(a)<P(b)<P(x1 )<P(x2). The function of Appendix 7 is started with xi=P(a), xi'=P(x1). This is the case in which eta=xi. The result is then:

BDD make (P(a), repfalse(Phia−,P(x1)), reptrue(Phia+,P(x1))).

The functions repfalse and reptrue are defined respectively in Appendix 5 and Appendix 6.

In Appendix 5, the case is that in which Phia−=Choice(P(b),Phib−,Phib+) with P(b)<P(x1), which gives the following result:

BDDmake (P(b), repfalse(Phib−,P(x1)), repfalse(Phib+,P(x1))). One sees in FIG. 1 that repfalse(Phib−,P(x1)) is the case in which Phib−=T, which yields T, and that repfalse(Phib+,P(x1)) is the case in which Phib+=Choice(P(x1),Phix1−,T) with xi=xi'=P(x1), which yields Phix1−, or in other words, Choice(P(x2),F,T). The result is then:

BDDmake (P(b),T,Choice(P(x2),F,T))=Choice(P(b),T, Choice(P(x2),F,T))

In Appendix 6, the case is that in which Phia+=Choice(P(x1),Phix1−,T) with xi=xi'=P(x1), which gives Phix1−, that is, Choice(P(x2),F,T).

The result is accordingly:

BDDmake (P(a), Choice(P(b),T,Choice(P(x2),F,T)), Choice(P(x2),F,T)), that is to say:

Choice (P(a), Choice(P(b),T,Choice(P(x2),F,T)), Choice (P(x2),F,T)).

The function BDDreduce (Phi,xi,xi') is then executed with xi=P(b) and xi'=P(x2). eta=P(a)<P(b); hence

```
:= BDDmake(P(a),BDDreduce(Choice(P(b),T,Choice(P(x2),T,F)),
P(b),P(x2)),BDDreduce(Choice(P(b),T,Choice(P(x2),F,T)),P(b),P(x2)))
  BDDreduce(Choice(P(b),T,Choice(P(x2),F,T)),P(b),P(x2))
  := BDDmake(P(b),repfalse(T,P(x2)),reptrue(Choice(P(x2),F,T),P(x2)))
  := BDDmake(P(b),T,T)
  := T
  BDDreduce(Choice(P(b),T,Choice(P(x2),F,T)),P(b),P(x2)))
  := BDDmake(P(b),repfalse(T,P(x2)),reptrue(Choice(P(x2),F,T),P(x2))
  := BDDmake(P(b),T,T)
  := T
:= BDDmake(P(a),T,T)
```

The BDD is reduced to T. The proof is obtained. The example of FIG. 1 has made it possible to demonstrate the mechanism of the proof for a formula Phiex with one variable. If there are multiple variables x, y, then the problem is to determine which atom P(x) or P(y) to take for xi' in such a way as to obtain the proof as fast as possible. Similarly, if in Phiex the choice of constants P(a) or P(b) for xi is of little importance in obtaining the proof, thanks to the symmetry of their occurrence, nevertheless for more complex BDDs the problem is to determine which atom P(a) or P(b) to take for xi.

One object of the invention is to choose for the atom xi an atom C that will allow the least possible choices in the BDD Phi for the mgu substitutions between the atom xi and the complementary atoms xi' to the atom xi in the BDD Phi. Then, from among the mgu substitutions, exploring with priority those that maximize the gain in information of the resulting BDD Phi. This object of the invention will be better understood in the ensuing description.

Appendix 8 describes the bFbT function, which enables the calculation of a pair whose first element is the number of false branches ending at F of a BDD Phi and whose second element is the number of true branches ending at T of the same BDD Phi. This function is recursive, since the number of false branches and the number of true branches of a BDD Phi are equal, respectively, to the sum of the numbers of false branches of the BDDs Phi− and Phi+ and to the sum of the numbers of true branches of the BDDs Phi− and Phi+. These numbers are initialized at (1,0) for a false leaf and at (0,1) for a true leaf.

Appendix 13 describes the proof function algorithm for a list q of triplets (Phi,Phi',Sigma). Upon initialization, q contains only a single triplet (Phi,Phi',Sigma), where Phi is the BDD of the formula to be proved. Since Phi is the BDD of a formula that expresses the fact that a conjunction of axioms Ax implies a proposition Psi, Phi' is the witness BDD of Phi defined as the BDD of the conjunction of the axioms Ax and the proposition Psi. Sigma (a) is the set of substitutions of prohibited atoms of Phi. Initially sigma is initialized at the empty set. Associated with this triplet are an information gain GI initialized at zero and an information quantity Q1, such that according to Appendix 8, (bF,bT) := bFbT(Phi')

Q1 := bF log(bF/(bF+bT))

The Prove(q) function is then executed until "failure" is obtained, which means that it was not possible to obtain any proof with the number of copies of Phi, or until "proven" is obtained, which means that a finite number of copies of Phi exist so that Phi is valid.

At point 1, if the list q is empty, then there is no BDD Phi that can be reduced to T; the proof fails.

At point 2, the list q is ordered in decreasing order of the information gains GI of the triplets (Phi,Phi',Sigma). This is due to the construction of q at point 7, which will be discussed hereinafter. Proceeding in accordance with Appendix 13, beginning at point 2 for the triplets (Phi,Phi', Sigma) of q, initiates the various branches of a search tree, also called an execution tree, which are defined by each of the triplets (Phi,Phi',Sigma). Extracting the first triplet (Phi, Phi',Sigma) of the list q thus means starting the branch of this search tree associated with the maximum information gain GI. This constitutes one strategy for passing through the execution tree by way of maximum information gain-first search. The triplet (Phi,Phi',Sigma) extracted from q serves to explore the branch initiated, along points 3–8. The triplet (Phi,Phi',Sigma) is eliminated from q to enable exploring the remainder of the search tree upon the return to point 1 dictated by point 8 or by point 4. These branches are either parallel branches to the branch of the triplet (Phi,Phi',Sigma) extracted, or daughter branches of the triplet (Phi,Phi', Sigma) constructed, as will be seen at point 7, depending on their information gain GI. In effect, the first triplet (Phi,Phi', Sigma) of the remaining list q will be that of the maximum information gain GI.

At point 3, if the witness BDD Phi' of the triplet (Phi, Phi',Sigma) is equal to T, then the formula is proven.

At point 4, if the witness BDD Phi' of the triplet (Phi, Phi',Sigma) is equal to F, then no proof exists for the triplet chosen; it is necessary to return to point 1 to attempt another triplet.

At point 5, for each atom A of Phi', two BDDs Phi0 and Phi'0 are calculated by the functions of Appendixes 3 and 4, from BDDs Phi[T/A], where T is substituted for by A in Phi; Phi[F/A], where F is substituted for A in Phi; Phi'[T/A], where T is substituted for by A in Phi'; and Phi'[F/A], where F is substituted for A in Phi'.

At point 6, a set of atoms complementary to A in Phi' is constructed with the aid of the functions of Appendixes 10–12. From this set, a set DeltaSigma of most general unifier mgu is constructed by seeking to unify the atom A with each complementary atom, in accordance with one of the unification procedures known in the prior art. As will be seen in point 7, each substitution σ of the set DeltaSigma adds one triplet (Phiσ,Phi'σ,Sigma) to the list q. This accordingly increases the number of daughter branches resulting from the choice of an atom A, or in other words the nondeterminism associated with the choice of an atom A, in the execution tree. By retaining only the atom A for which the number card (DeltaSigma) of DeltaSigma elements is the lowest, the number of daughter branches is minimized. This constitutes a minimization of the nondeterminism.

At point 7, for each substitution a of DeltaSigma, the BDDs Phiσ and Phi'σ are calculated with the aid of the function of Appendix 7. Hence a new triplet (Phiσ,Phi'σ, Sigma) is then created for each substitution, by using the Sigma set of the triplet (Phi,Phi',Sigma) extracted at point 2. The information gain GI of each BDD Phi'σ is calculated, as for every BDD Phi, with the aid of Appendix 8, as follows:

Since QI(Phi') and GI(Phi') have been calculated at the time the triplet (Phi,Phi',Sigma) was created, (bF,bT) := bFbT(Phi'σ)

QI(Phi'σ) bF log( bF/(bF+bT))

GI(Phi'σ) := GI(Phi')+QI(Phi'σ)−QI(Phi')−log( card (DeltaSigma)+1).

GI(Phi'0) is calculated in the identical way by replacing Phi'σ with Phi'0.

The triplet (Phi0,Phi'0,Sigma U DeltaSigma) is created where U embodies the union of the two sets, Sigma and DeltaSigma.

Each triplet created is inserted into the list q, from the head of the list, before the first triplet of the list q of gain GI less than that of the triplet inserted.

At point 8, the procedure is repeated.

---

Appendix 1

```
fun BDDmake (xi,Phi-,Phi+)
    If Phi- = Phi+    then
:= Phi+
    If not    then
:= Choice (xi,Phi-,Phi+)
```
Appendix 2

```
fun BDDneg (Phi)
    If Phi= T    then
:= F
    If Phi= F    then
:= T
    If Phi= Choice(xi,Phi-,Phi+)    then
:=Choice(xi,BDDneg (Phi-),BDDneg(Phi+))
```
Appendix 3

```
fun BDDand (Phi,Phi')
    If Phi= F    then
:= F
    If Phi'= F    then
:= F
    If Phi= T    then
:= Phi'
    If Phi'= T    then
:= Phi
    If Phi=Choice(xi,Phi-,Phi+) and Phi'=Choice(xi',Phi'-,Phi'+)
        If xi < xi'    then
:= BDDmake (xi, BDDand (Phi-,Phi'), BDDand (Phi+,Phi'))
        If xi > xi'    then
:= BDDmake (xi', BDDand (Phi,Phi'-), BDDand (Phi,Phi'+))
        If not    then
:= BDDmake (xi, BDDand (Phi-,Phi'-), BDDand (Phi+,Phi'+))
```
Appendix 4

```
fun BDDor (Phi,Phi')
    If Phi=T    then
:= T
    If Phi'=T    then
:= T
    If Phi=F    then
:= Phi'
    If Phi'=F    then
:= Phi
    If Phi=Choice(xi,Phi-,Phi+) and Phi'=Choice(xi',Phi'-,Phi'+)
        If xi <xi'    then
:= BDDmake (xi, BDDor(Phi-,Phi'), BDDor(Phi+,Phi'))
        If xi >xi'    then
:= BDDmake (xi', BDDor(Phi,Phi'-), BDDor(Phi,Phi'+))
        If not    then
:= BDDmake (xi, BDDor(Phi-,Phi'-), BDDor(Phi+,Phi'+))
```
Appendix 5

```
fun repfalse (Phi,xi')
    If Phi=T    then
:= T
    If Phi=F    then
:= F
    If Phi=Choice(xi,Phi-,Phi+)
        If xi < xi'    then
:= BDDmake (xi, repfalse(Phi-,xi'), repfalse(Phi+,xi'))
        If xi = xi'    then
:= Phi-
        If not    then
:= Phi
```
Appendix 6

```
fun reptrue (Phi,xi')
    If Phi=T    then
:= T
    If Phi=F    then
:= F
    If Phi=Choice(xi,Phi-,Phi+)
        If xi < xi'    then
:= BDDmake (xi, reptrue(Phi-,xi'), reptrue(Phi+,xi'))
        If xi = xi'    then
:= Phi+
```

```
       If not     then
:= Phi
```
Appendix 7

```
fun BDDreduce (Phi,xi,xi') with xi<xi'
       If Phi=T    then
:= T
       If Phi=F    then
:= F
       If Phi=Choice(eta,Phi-,Phi+)
          If eta < xi    then
:= BDDmake (eta, BDDreduce(Phi-,xi,xi'), BDDreduce(Phi+,xi,xi'))
          If eta = xi    then
:= BDDmake (xi, repfalse(Phi-,xi'), reptrue(Phi+,xi'))
          If not    then
:= BDDmake (xi, repfalse(Phi,xi'), reptrue(Phi,xi'))
```
Appendix 8

```
fun bFbT (Phi)
       If Phi = F    then
:= (1,0)
       If Phi = T    then
:= (0,1)
       If Phi = Choice(xi,Phi-,Phi+)    then
:= bFbT (Phi-) + bFbT (Phi+)
```
Appendix 9

```
fun BDDreorder (Phi,vars)
       If Phi = T    then
:= T
       If Phi = F    then
:= F
       If Phi = Choice(A,Phi-,Phi+))
          If vars = A::rest    then
:= BDDmake (A,BDDreorder(Phi-,rest),BDDreorder(Phi+,rest))
          If vars = A'::rest    then
:= BDDmake (A',BDDreorder(repfalse(Phi-,A'),rest),BDDreorder(reptrue(Phi+,A'), rest))
```
Appendix 10

```
fun Bnegatives (Phi)
       If Phi = T
:= {}
       If Phi = F
:= {}
       If Phi = Choice(xi,Phi-,Phi+)    then
          if Phi- = T    then
:= Bnegatives (Phi-) U Bnegatives (Phi+)
          If not    then
:= Bnegatives (Phi-) U Bnegatives (Phi+) U {xi}
```
Appendix 11

```
fun Bpositives (Phi)
       If Phi = T
:= {}
       If Phi = F
:= {}
       If Phi = Choice(xi,Phi-,Phi+)    then
          if Phi+ = T    then
:= Bpositives (Phi-) U Bpositives (Phi+)
          If not    then
:= Bpositives (Phi-) U Bpositives (Phi+) U {xi}
```
Appendix 12

```
fun Complement (A,Phi)
:= Bpositives (repfalse(Phi,A)) U Bnegatives (reptrue(Phi,A))
```
Appendix 13

```
fun Prove(q)
   1. If q = {}    then
:= Failure;
   If not,
   2. Extract the first triplet (Phi,Phi',Sigma) from the list q and eliminate
      said first triplet from the list q,
   3. if Phi' = T    then
:= Proven.
   4. If not, if Phi' = F then
   return to point 1.
   5. If not, for each atom A of Phi',
      calculate Phi0 := BDDand (Phi [T/A],Phi [F/A])
      calculate Phi'0 := BDDand (Phi0, BDDor(Phi'[T/A],Phi'[F/A])
```

-continued 6. calculate the set DeltaSigma of the mgus which unify A at a
   complementary atom in Phi', and which are not in Sigma.
return the atom A and the set DeltaSigma for which card (DeltaSigma) is
minimal,
7. for each σ of DeltaSigma, calculate the triplet (Phiσ,Phi'σ,Sigma) and the
information gain GI of Phi'σ,
calculate the triplet (Phi0,Phi'0,Sigma U DeltaSigma) and the information gain GI
of Phi'0,
add the triplets calculated at the list q by sorting this list in decreasing order of
the information gain GI,
8. return to point 1.

I claim:

1. A method for assisting in developing a product by automatic proof of propositions that describe physical systems in first order logic, said method being implemented on a computer having a memory, comprising the steps of: providing in said memory a proposition to be demonstrated in the form of at least one binary decision diagram (BDD), wherein said proposition is in first order logic and describes a physical system related to said product, attempting to reduce the binary decision diagram (BDD) to a constant T which symbolizes a truth value related to said physical system, wherein said attempting to reduce includes performing at least one substitution by constructing and exploring nodes of a search tree having a plurality of possible substitutions, each being associated with one binary decision diagram, wherein said exploring includes maximizing an information gain calculated at each node of the search tree, deciding whether or not said physical system needs to be modified to work properly in said product being developed based on whether or not, respectively, said step of attempting to reduce is successful in reducing said binary decision diagram to said constant T, and, upon deciding that the physical system needs to be modified, modifying said physical system accordingly to improve said product.

2. The method of claim 1, wherein constructing said search tree includes determining a branching factor by minimizing the branching factor.

3. The method of claim 2, further comprising calculating the information gain at each node associated with a BDD Phi as the difference between the quantity of information Qi(Phi) at the node and the quantity of information at the root of the search tree, said difference being lessened by the sum of the logarithms of the number immediate successors of the nodes from the branch between the root and a node in question, including the root and excluding the node in question, where Qi(Phi)=bF log(bF/(BF+bT)), which bF is the number of false branches of the BDD Phi, and bT is the number of true branches of the BDD Phi.

4. The method of claim 2, wherein said physical system is an information processing system, and said method further includes using said truth value to assure coherence of said information processing systems.

5. An information processing system for use in developing a product by automatic proof of propositions that describe physical systems in first order logic, comprising a memory, means for providing in said memory a proposition to be demonstrated in the form of at least one binary decision diagram (BDD), wherein said proposition is in first order logic and describes a physical system related to said product, and means for attempting to reduce the binary decision diagram (BDD) to a constant T which symbolizes a truth value related to said physical system indicating that said physical system need not be modified to work properly in said product being developed, wherein said means for attempting to reduce includes means for performing at least one substitution by constructing and exploring nodes of a search tree having a plurality of possible substitutions, each being associated with one binary decision diagram, and means for, upon a BDD indicating that the physical system needs to be modified, modifying said physical system accordingly to improve said product.

* * * * *

UNITED STATES PATENT AND TRADEMARK OFFICE
CERTIFICATE OF CORRECTION

PATENT NO. : 5,905,977
DATED : May 18, 1999
INVENTOR(S) : Jean GOUBAULT

It is certified that error appears in the above-identified patent and that said Letters Patent is hereby corrected as shown below:

On the title page,

Item [63] Related U.S. Application Data,
after "filed" and before "PCT/FR94/01089" insert - - May 17, 1995 and now abandoned, which is a 371 of - -. Delete "abandoned" and insert - - filed September 19, 1994 - -. Line 1, delete "as".

Signed and Sealed this

Twenty-eighth Day of March, 2000

Attest:

Q. TODD DICKINSON

*Attesting Officer*   *Commissioner of Patents and Trademarks*